(12) United States Patent
Kim et al.

(10) Patent No.: US 11,116,108 B2
(45) Date of Patent: Sep. 7, 2021

(54) ELECTRONIC DEVICE WITH REMOVABLE MODULE

(71) Applicant: Samsung Electronics Co., Ltd., Gyeonggi-do (KR)

(72) Inventors: Taeyoung Kim, Gyeonggi-do (KR); Sehyun Lee, Gyeonggi-do (KR); Hyeonji Ka, Gyeonggi-do (KR); Yunpil Yeom, Gyeonggi-do (KR); Dongkyu Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/650,550

(22) PCT Filed: Oct. 27, 2017

(86) PCT No.: PCT/KR2017/012027
§ 371 (c)(1),
(2) Date: Mar. 25, 2020

(87) PCT Pub. No.: WO2019/078395
PCT Pub. Date: Apr. 25, 2019

(65) Prior Publication Data
US 2020/0323104 A1 Oct. 8, 2020

(30) Foreign Application Priority Data

Oct. 16, 2017 (KR) .......................... 10-2017-0134217

(51) Int. Cl.
*H05K 7/20* (2006.01)
*H05K 5/00* (2006.01)
(Continued)

(52) U.S. Cl.
CPC ....... *H05K 7/20409* (2013.01); *H05K 5/0017* (2013.01); *H05K 5/0213* (2013.01);
(Continued)

(58) Field of Classification Search
None
See application file for complete search history.

(56) References Cited

U.S. PATENT DOCUMENTS 3,257,585 A * 6/1966 Ransom .................... H05K 7/18
361/784
3,596,139 A * 7/1971 Walsh .................. H05K 7/1417
174/562
(Continued)

FOREIGN PATENT DOCUMENTS

KR 10-0909272 B1 3/2009
KR 10-1429893 B1 8/2014
(Continued)

OTHER PUBLICATIONS

Smart Devices. Smart Devices & Mobile Trends Biog.; Ariistic PC, Samsung ArtPCPulse; <http://smartdevice.kr/2070>.

*Primary Examiner* — Xanthia C Cunningham
(74) *Attorney, Agent, or Firm* — Cha & Reiter, LLC

(57) ABSTRACT

An electronic device according to various embodiments comprises: a case for accommodating at least one electronic part; an upper cover for covering at least one part of an upper end of the case; and a connector, which is arranged on the upper cover, for electrically connecting an external module and the at least one electronic part, wherein the upper cover can guide heat generated from the at least one electronic part such that the heat is discharged to the outside along a side part of the upper cover. Additional other embodiments are possible.

15 Claims, 10 Drawing Sheets

(51) Int. Cl.
*H05K 5/02* (2006.01)
*H05K 5/03* (2006.01)

(52) U.S. Cl.
CPC ............ *H05K 5/0247* (2013.01); *H05K 5/03* (2013.01); *H05K 7/20172* (2013.01)

(56) References Cited

U.S. PATENT DOCUMENTS

| | | | | |
|---|---|---|---|---|
| 5,671,856 A | * | 9/1997 | Lisch | A01K 97/06 |
| | | | | 206/519 |
| 6,175,494 B1 | * | 1/2001 | Komatsu | F28D 1/053 |
| | | | | 165/80.3 |
| 6,351,383 B1 | * | 2/2002 | Payton | F42B 15/08 |
| | | | | 165/80.3 |
| 6,459,577 B1 | * | 10/2002 | Holmes | G06F 1/20 |
| | | | | 165/80.3 |
| 6,704,196 B1 | * | 3/2004 | Rodriguez | H05K 7/20736 |
| | | | | 165/104.33 |
| 6,735,086 B1 | * | 5/2004 | Weber | F42B 15/08 |
| | | | | 165/185 |
| 6,778,389 B1 | * | 8/2004 | Glovatsky | H01L 25/065 |
| | | | | 165/80.1 |
| 6,865,085 B1 | * | 3/2005 | Ferris | H05K 7/20445 |
| | | | | 361/721 |
| 6,894,907 B2 | * | 5/2005 | Gustine | H05K 5/0004 |
| | | | | 361/756 |
| 7,101,187 B1 | | 9/2006 | Deconinck et al. | |
| 7,180,736 B2 | * | 2/2007 | Glovatsky | H05K 7/1434 |
| | | | | 361/688 |
| 7,215,557 B2 | * | 5/2007 | Glovatsky | H05K 1/144 |
| | | | | 361/748 |
| 7,418,995 B2 | * | 9/2008 | Howard | H05K 7/20918 |
| | | | | 165/121 |
| 8,189,345 B2 | * | 5/2012 | Rapp | F42B 15/01 |
| | | | | 361/797 |
| 8,451,604 B2 | * | 5/2013 | Bhattacharya | H05K 7/20145 |
| | | | | 361/690 |
| 9,069,535 B2 | * | 6/2015 | Degner | G02B 6/0001 |
| 9,086,072 B1 | * | 7/2015 | Davis | F04D 25/166 |
| 9,225,102 B1 | | 12/2015 | Larsen et al. | |
| 9,357,663 B2 | * | 5/2016 | Haaf | H05K 5/0239 |
| 10,327,357 B2 | * | 6/2019 | Comes | H05K 1/0201 |
| 10,729,029 B2 | * | 7/2020 | Logan | H05K 7/1434 |
| 2008/0190493 A1 | * | 8/2008 | Oh | G01L 19/0038 |
| | | | | 137/554 |
| 2010/0002383 A1 | * | 1/2010 | Yeh | G06F 1/183 |
| | | | | 361/695 |
| 2010/0264120 A1 | | 10/2010 | Reineke et al. | |
| 2014/0150464 A1 | * | 6/2014 | Bloedow | F25B 21/02 |
| | | | | 62/3.62 |
| 2014/0321046 A1 | * | 10/2014 | Sinha | G06F 1/20 |
| | | | | 361/679.33 |
| 2014/0362576 A1 | | 11/2014 | Degner et al. | |
| 2014/0361671 A1 | | 12/2014 | Degner et al. | |

FOREIGN PATENT DOCUMENTS

| | | |
|---|---|---|
| KR | 10-2016-0003288 A | 1/2016 |
| WO | 2017/175949 A1 | 10/2017 |

* cited by examiner

ELECTRONIC DEVICE WITH REMOVABLE MODULE

CROSS REFERENCE TO RELATED APPLICATIONS

This application is a National Phase Entry of PCT International Application No. PCT/KR2017/012027, which was filed on Oct. 27, 2017, and claims a priority to Korean Patent Application No. 10-2017-0134217, which was filed on Oct. 16, 2017, the contents of which are incorporated herein by reference.

TECHNICAL FIELD

Various embodiments of the disclosure relate to an electronic device for an attachable and detachable module and, more particularly, to an electronic device to which an external module can be detachably attached in a rotary type.

BACKGROUND ART

Personal computer systems that support various functions are provided. These systems are required to be small-sized in terms of design and to support various functions with high performance.

A user can selectively mount and use a module, which provides functions that the user needs, on an electronic device. For example, a user can add an external hard drive to increase the available storage capacity of an electronic device or can connect an external speaker module or an external camera module to an electronic device in a wire or wireless type.

DISCLOSURE OF INVENTION

Technical Problem

In the related art, in order to additionally mount and use an external module on an electronic device, a user has to disassemble every part of the main case of the electronic device and then mount the external module in the electronic device.

Further, when an external module is connected to an electronic device in a wire or wireless type, cables may cause inconvenience to a user or the processing speed by wireless communication may be lower than that of connection through a connector. As the method of directly fastening an external module using a connector, there may be a fastening method of fastening an external module by sliding it or a fastening method that uses a magnetic force, but there may be a problem that the pins of connectors are easily worn or a module is easily separated due to a weak fastening force by a magnetic force. When an external module is directly mounted on a side of an electronic device, a space for discharging heat from the inside of an electronic device may not be sufficiently secured.

Various embodiments of the disclosure provide an electronic device to which an external module can be intuitionally detachably attached without deteriorating the performance of the electronic device.

Solution to Problem

An electronic device according to various embodiments of the disclosure includes: a case configured to accommodate at least one electronic part; an upper cover configured to cover at least a portion of an upper end of the case; and a connector disposed on the upper cover to electrically connect an external module and the at least one electronic part, in which the upper cover may guide heat generated by the at least one electronic part so that the heat is discharged to the outside along a side of the upper cover.

An electronic device according to various embodiments of the disclosure includes: a case configured to accommodate at least one electronic part; a vent disposed at an upper portion of the case; an upper cover configured to cover at least a portion of the case; and a connector disposed on the upper cover to electrically connect an external module and the at least one electronic part, in which the vent may guide heat generated by the at least one electronic part so that the heat is discharged to the upper cover, in which the upper cover may guide the heat generated by the at least one electronic part so that the heat is discharged to the outside along a side of the upper cover.

An electronic device according to various embodiments of the disclosure includes: a case configured to accommodate at least one electronic part; a vent disposed at an upper portion of the case; an upper cover configured to cover at least a portion of the case; a connector disposed on the upper cover to electrically connect an external module and the at least one electronic part; and a cable configured to transmit a signal from the connector to the electronic part, in which the vent guides heat generated by the at least one electronic part so that the heat is discharged to the upper cover, in which the cable is disposed through the vent.

Advantageous Effects of Invention

According to various embodiments of the disclosure, it is possible to provide a customized electronic device on which a user can selectively mount desired external modules, if necessary.

Since an external module can be attached/detached by rotating the external module, a user can more intuitionally and simply fasten a module and it is possible to prevent damage to the electronic device using a structure that minimizes wear of a connector when rotating.

It is possible to discharge heat generated in the electronic device using a cover structure at the upper portion of the main body of the electronic device according to various embodiments and it is possible to effectively discharge driving information using light from LEDs.

MODE FOR THE INVENTION

Figure 1A:
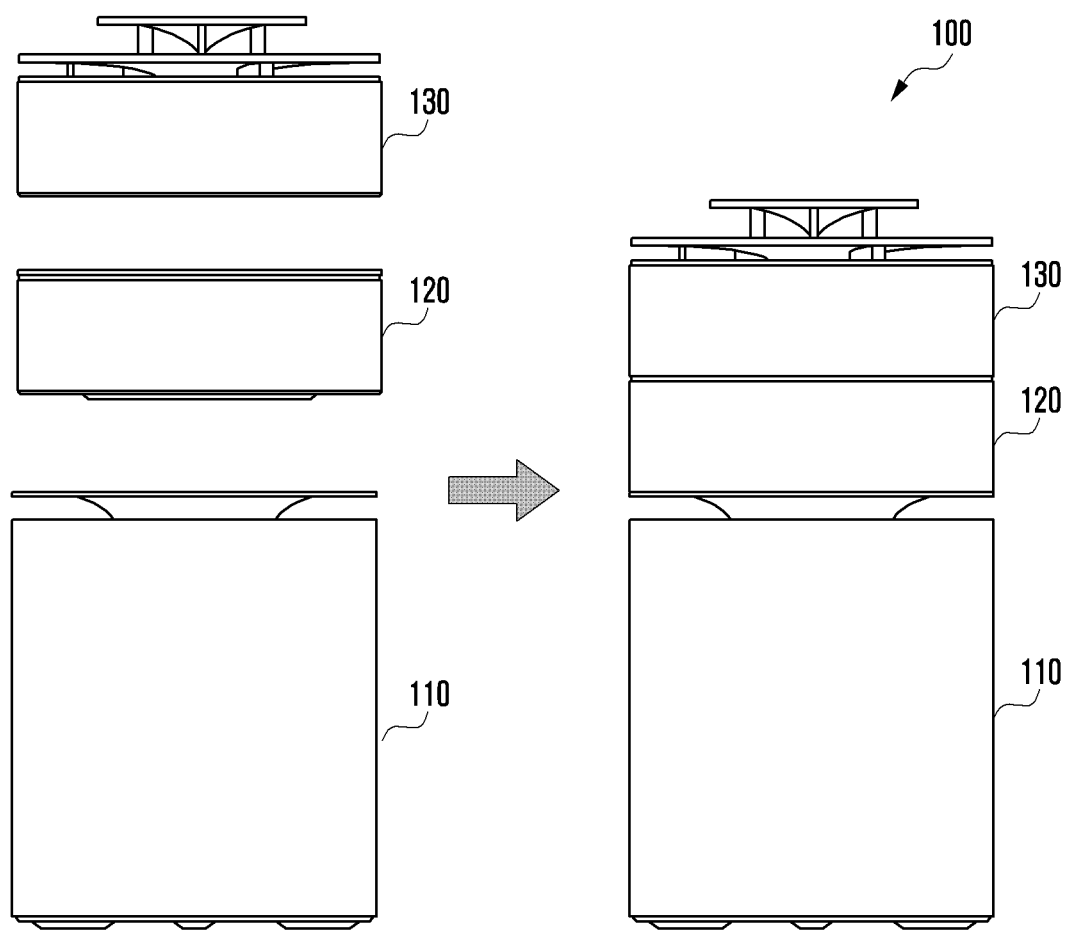
FIGS. 1A to 1C are views illustrating a coupling structure of an electronic device 100 according to various embodiments of the disclosure.

Hereinafter, various embodiments will be described with reference to the accompanying drawings. It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements.

As used herein, the expression "have", "may have", "include", or "may include" refers to the existence of a corresponding feature (e.g., numeral, function, operation, or constituent element such as component), and does not exclude one or more additional features.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases.

As used herein, such terms as "1st" and "2nd," or "first" and "second" may be used to simply distinguish a corresponding component from another, and does not limit the components in other aspect (e.g., importance or order).

It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly or via the other element(e.g., a third element).

The expression "configured (or set) to", used in this specification, may be interchangeably used with, for example, "suitable for," "having the capacity to," "designed to," "adapted to," "made to," or "capable of" according to circumstances. The term "configured (or set) to" may not necessarily mean "specifically designed to" in hardware. Instead, in some cases, the expression "device configured to" may mean that the device "can~" together with other devices or components. For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical terms and scientific terms, may have the same meaning as commonly understood by a person of ordinary skill in the art to which the disclosure pertains. Terms, such as those defined in commonly used dictionaries, should be interpreted as having a meaning that is the same or similar to their meaning in the context of the relevant art and will not be interpreted in an idealized or overly formal sense unless expressly so defined herein. In some cases, even the term defined in the disclosure should not be interpreted to exclude embodiments of the disclosure.

An electronic device according to various embodiments of the disclosure may be a device with a communication function. For example, the electronic device may include at least one of a smart phone, a tablet personal computer (PCs), a mobile phone, a video phone, an e-book reader, a desktop PC, a laptop PC, a netbook computer, a personal digital assistant (PDA), a portable multimedia player (PMP), a MP3 player, a mobile medical device, a camera, a wearable device (e.g., head-mounted-device (HMD) such as electronic glasses, electronic clothes, an electronic bracelet, an electronic necklace, an electronic appcessory, an electronic tattoo, or a smart watch).

According to some embodiments, the electronic device may be a smart home appliance with a communication function. The smart home appliances may include at least one of, for example, televisions, digital video disk (DVD) players, audio players, refrigerators, air conditioners, cleaners, ovens, microwaves, washing machines, air purifiers, set-top boxes, TV boxes (e.g., HomeSync™ of Samsung, Apple TV™, or Google TV™), game consoles, electronic dictionaries, electronic keys, camcorders, or electronic frames.

According to some embodiments, the electronic device may include at least one of various medical devices such as a magnetic resonance angiography (MRA) scanner, a magnetic resonance imaging (MRI) scanner, a computed tomography (CT) scanner, a scanner, an ultrasonograph, or the like, a navigation device, a Global Positioning System (GPS) receiver, an Event Data Recorder (EDR), a Flight Data Recoder (FDR), a vehicle infotainment device, an electronic equipment for ship (for example a ship navigation device and gyro-compass and the like, avionics, a security device, a head unit for vehicle, an industrial or household robot, ATM(automatic teller machine) in banking facilities or POS(point of sales) in stores.

According to some embodiments, the electronic device may include at least one of a part of furniture or a building/structure having a communication function, an electronic board, an electronic signature receiving device, a projector, and various kinds of measuring instruments (e.g., a water meter, an electric meter, a gas meter, a radio wave meter, and the like). An electronic device according to various embodiments of the disclosure may be a combination of one or more of above described various devices. Also, an electronic device according to various embodiments of the disclosure may be a flexible device. Also, an electronic device according to various embodiments of the disclosure is not limited to the above described devices.

Figure 1B:
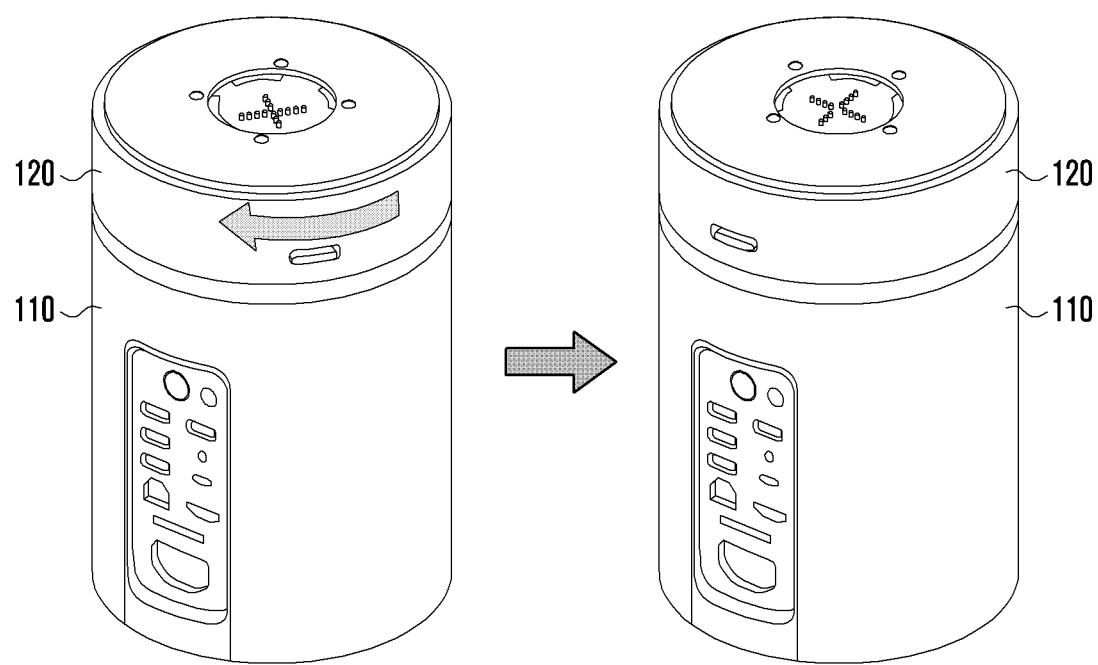
Figure 1C:
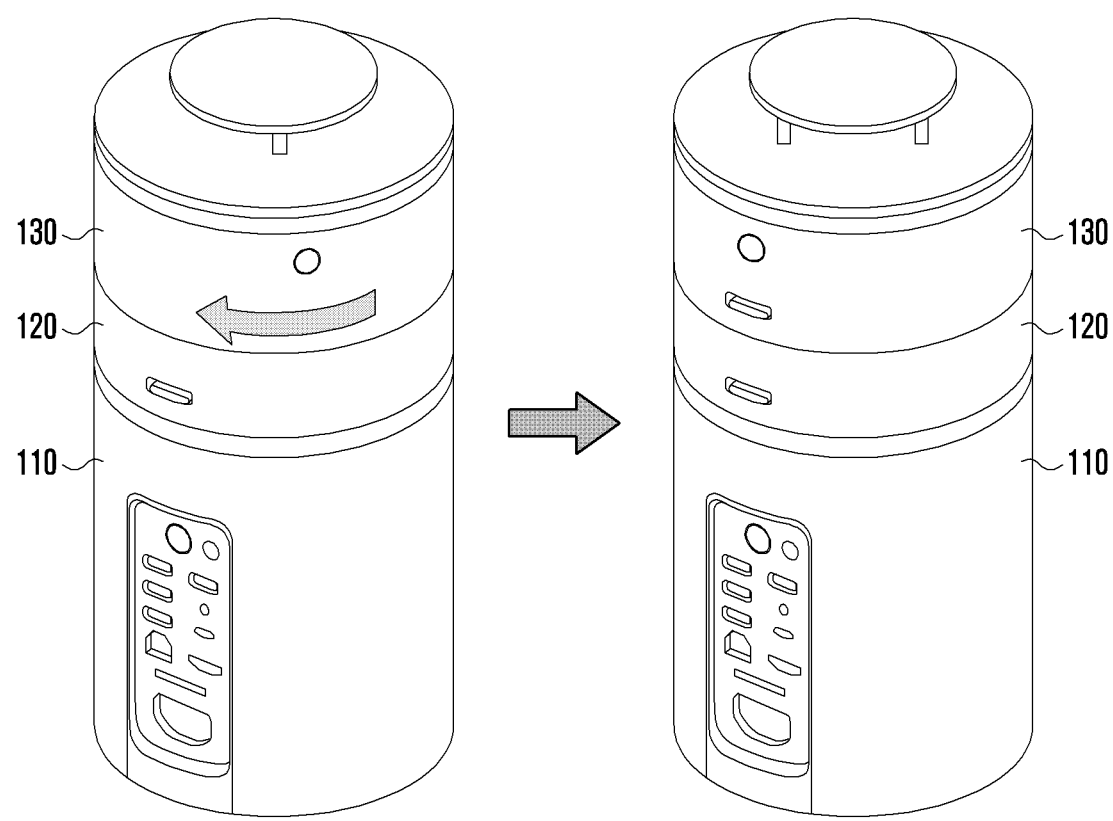

FIGS. 1A to 1C are views illustrating a coupling structure of an electronic device 100 according to various embodiments of the disclosure.

Referring to FIG. 1A, an electronic device 100 according to various embodiments may include a main body 110 and at least one external module 120, 130 that can be detachably attached to the main body 110.

For example, as shown in FIG. 1A, the electronic device 100 may be configured such that at least one external module 120, 130 can be coupled to the upper portion of the main body 110.

For example, a user may couple and use only one external module on the main body 110 or may couple and use a plurality of modules by coupling another external module to the upper portion of the external module coupled to the main body.

According to various embodiments, the external module 120, 130 may include at least one of a storage module, an audio output module, or a camera module.

For example, the electronic device 100 may be used with one storage module coupled to the upper portion of the main body. As another example, the electronic device may be configured such that a plurality of modules is coupled to the main body 110 or a storage module and an audio output module are separately coupled to the main body 110.

According to various embodiments, the storage module may include an HDD (Hard Disk Drive), a Phase Change RAM (PRAM), a Magnetroresistive RAM (MRAM), a Spin-Transfer Troque MRAM (STT-MRAM), a Ferroelectric RAM (FRAM), or a Resistive RAM (RRAM), but is not limited thereto.

According to various embodiments, the audio output module can change sound and electrical signal into each other. According to an embodiment, the audio output module can obtain sound through an input device or can output sound to the outside.

According to various embodiments, the camera module can take still images and moving images. According to an embodiment, the camera module may include one or more lenses, an image sensor, an image signal sensor, or a flash.

FIGS. 1B and 1C are views showing a method of coupling external modules 120 and 130 to the main body 110 according to an embodiment.

According to various embodiments, the main body 110 of the electronic device 100 and the external modules 120 and 130 each may have one connector. The connectors can electrically connect the main body 110 and the external modules 120 and 130 or can electrically connect the external modules 120 and 130 to each other. For example, when the external modules 120 and 130 are connected to the main body 110, electronic parts in the main body 110 and the external modules 120 and 130 can be electrically connected.

As shown in FIGS. 1B and 1C, the external module 120 according to various embodiments can be mounted on the main body 110 by being rotated about an axis of the main body 110.

For example, the external module 120 can be attached to or detached from the upper portion of the main body 110 by being rotated about a central axis of the connector disposed at an end of an upper cover of the main body 110. In the same way, another external module 130 can be additionally mounted on the external module 120.

According to the electronic device 100 of various embodiments, a user can selectively mount the external modules 120 and 130 at desired positions on the main body 110.

According to an embodiment, the main body 110 of the electronic device 100 and the external modules 120 and 130 that can be detachably attached to the upper end of the main body 110 are formed substantially in cylindrical shapes, so the external modules 120 and 130 can be mounted on or separated from the main body 110 by rotating.

Figure 2A:
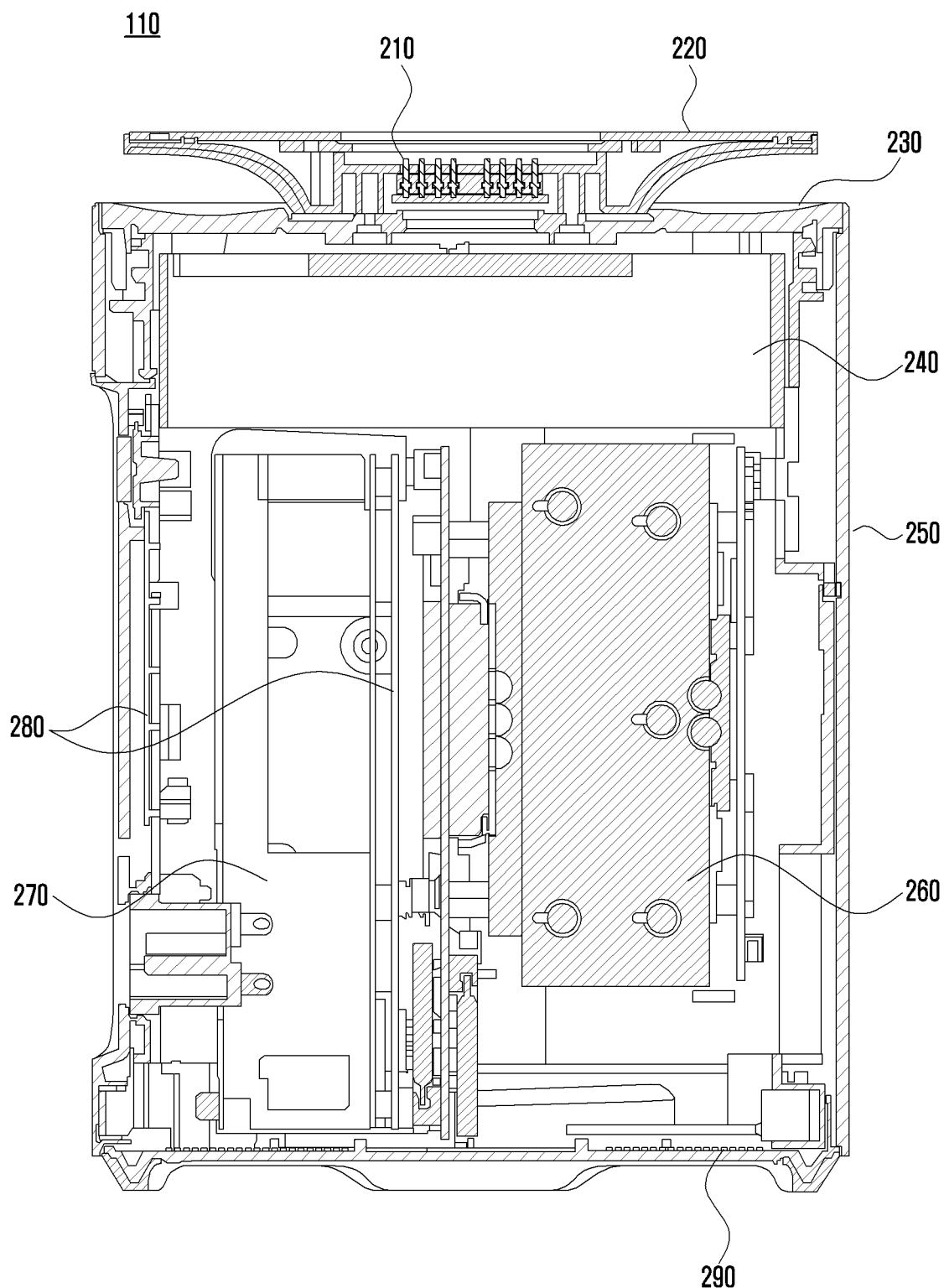
FIG. 2A is a cross-sectional view of the main body of the electronic device according to various embodiments of the disclosure.
Figure 2B:
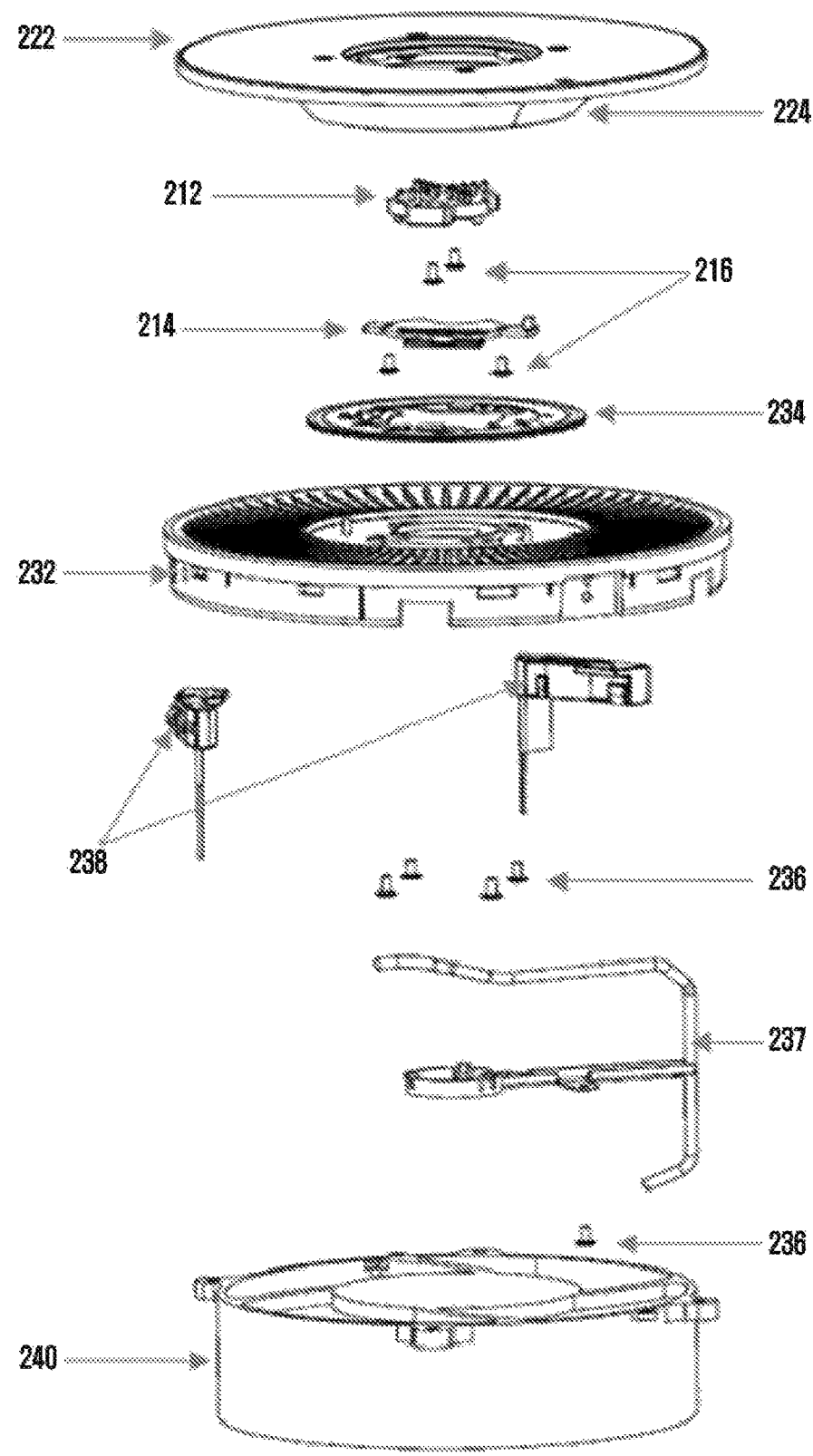
FIGS. 2B and 2C are exploded perspective views of the main body shown in FIG. 2A.
Figure 2C:
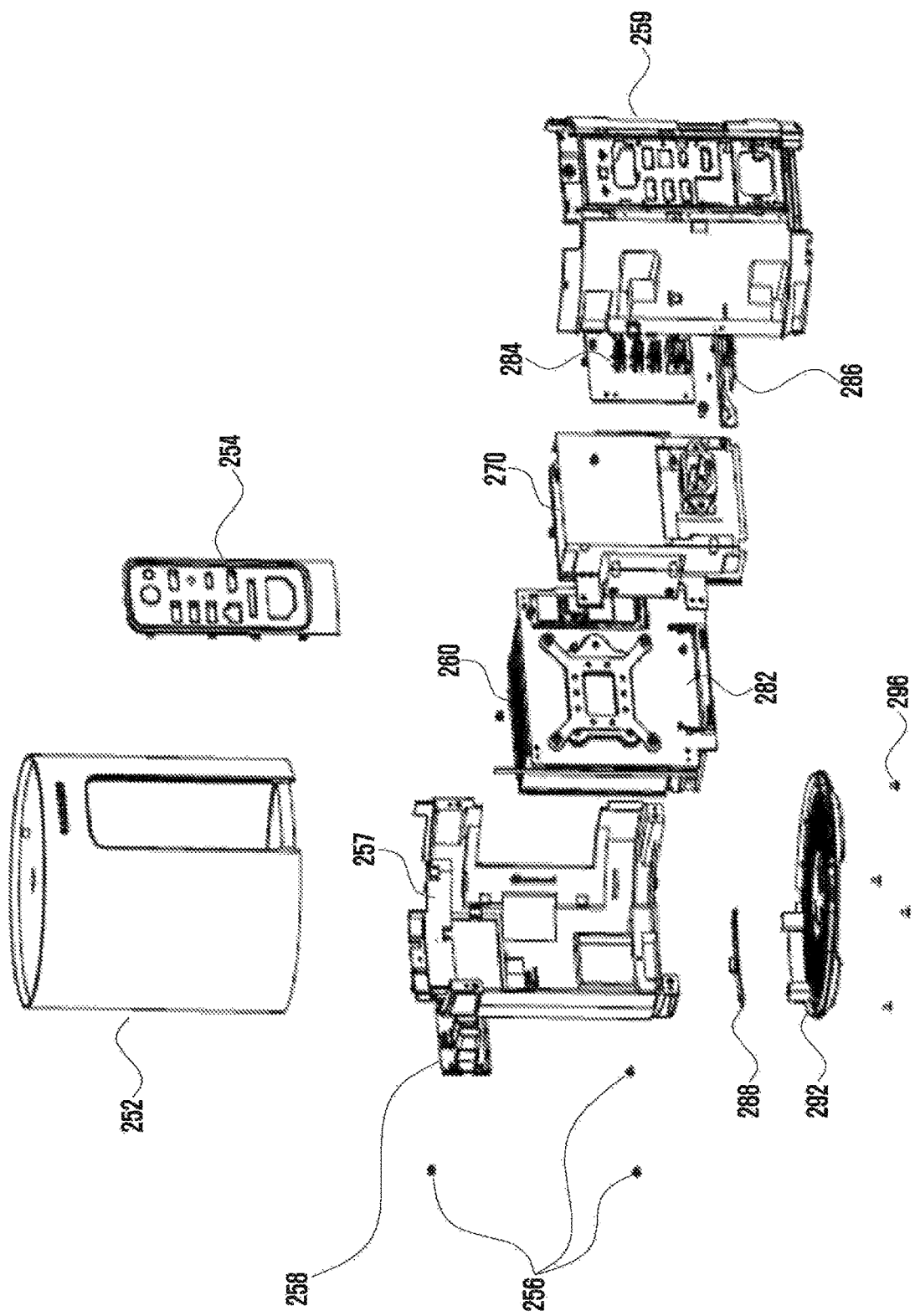

FIG. 2A is a cross-sectional view of the main body 110 of the electronic device 100 according to various embodiments and FIGS. 2B and 2C are exploded perspective views of the main body 110.

Referring to FIG. 2A, the main body 110 of the electronic device 100 according to various embodiments may include one or more electronic parts 240, 260, 270, and 280 and a case 250 for accommodating the electronic parts 240, 260, 270, and 280.

For example, the main body 110 may include at least one circuit board 280 and a power supplier (SMPS) 270. The electronic parts in the main body 110 may generate heat when they are driven and the electronic device needs to appropriately discharge the heat generated by the electronic parts to prevent damage due to overheat.

The main body 110 of the electronic device 100 according to various embodiments may include a heat sink 260 and a cooling fan 240 to discharge the heat generated by the electronic parts in the main body 110.

For example, the cooling fan 240 may supply air inside from a lower end 290 of the main body 110 when it is driven, and the air flowing inside may be discharged to an upper end 230 of the main body through the inside of the main body 110.

For example, the lower end 290 and the upper end 230 of the case 250 of the main body 110 each may have a vent through which air can pass.

The main body 110 of the electronic device 100 according to various embodiments may further include an upper cover 220 that covers at least a portion of the upper end of the case 250 that accommodates at least one electronic part.

As shown in FIG. 2A, the upper cover 220 according to various embodiments may not cover at least a portion (e.g., the vent) of the upper end 230 of the case 250 so that the heat generated by the electronic parts can be discharged outside through the vent of the upper end 230 of the case 250.

For example, the upper cover 220 may induce the heat generated by the electronic part to be discharged outside along the sides of the upper cover 220 by air. To this end, the upper cover 220 may be formed to gradually widen upward, as shown in FIG. 2A.

According to various embodiments, the upper cover 220 may further have connectors 210 that can electrically connect the external modules 120 and 130 and the electronic parts.

For example, specific electrical signal may be transmitted to the external modules 120 and 130 mounted on the main body 110 from the main body 110 or signals may be received to the main body 110 from the external modules 120 and 130 through the connectors 210.

According to an embodiment, the connectors 210 may be positioned at the center of the upper cover 220.

The external modules 120 and 130 have connectors corresponding to the connectors 210 of the main body 110, and the main body 110 and the external modules 120 and 130 can be electrically connected by contact of the connectors 210 of the main body 110 and the connectors of the external modules 120 and 130.

The external modules 120 and 130 can be attached to or detached from the upper end of the main body 110 by being rotated about an axis that is the center of the connectors 210 of the main body 110 and the connectors of the external modules 120 and 130. Accordingly, the connectors 210 of the main body 110 are positioned at the center of the upper cover 220, whereby there may be no need for unnecessarily securing a space when the external modules are coupled.

FIG. 2B is an exploded perspective view of the main body 110 according to various embodiments of the disclosure and FIG. 2C is an exploded perspective view of the main body 110 according to various embodiments of the disclosure.

Referring to FIGS. 2B and 2C, the main body 110 of the electronic device 100 according to various embodiments may include therein at least one electronic parts of at least one circuit board (e.g., a main board 282, a port board 284, a 3 in 1 board 286, and an MIC board 288) and a power supplier (e.g., an SMPS 270).

The main body 110 may include a heat sink 260 for absorbing heat from the electronic parts and discharging the heat to the outside and an inner case (e.g., a holder front 257 and a holder rear 259) that supports the electronic parts and the heat sink 260.

The main body 110 according to various embodiments may include an outer case 252 disposed outside the inner case 257, 259 and accommodating the electronic parts in the main body 110.

The outer case 252 may have at least one hole 254 to expose a port for connection with an external device to the outside.

The main body 110 according to various embodiments may include at least one antenna (e.g., a cover antenna 258, a main antenna, and an assistant antenna 238).

According to an embodiment, the outer case 252 may be made of a metal material. For example, the antennas 238 and 258 may be disposed on the top of the outer case 252 to prevent deterioration of their characteristics due to the outer case 252.

The main body 110 according to various embodiments may have a vent at each of the lower portion and the upper portion to discharge the heat generated by the electronic parts therein. For example, a vent inlet 292 through which air can flow inside may be formed at the lower portion of the main body 110 and a vent outlet 232 through which air can be discharged from the inside may be formed at the upper portion of the main body 110. A cooling fan 240 that blows air inside through the vent inlet 292 and discharges air through the vent outlet 232 may be further included.

The main body 110 according to various embodiments may include an upper cover 220 that covers at least a portion of the vent 232 at the upper portion of the main body 110.

For example, the upper cover 220 may have a plate mount 222 on the top so that the upper cover 220 can be mechanically fastened to the external modules 120 and 130, and a holder mount 224 that induces airflow to a side.

The upper cover 220 may have connectors 210 for electrically connection with the electronic parts in the main body 110 and the external modules 120 and 130.

For example, the connectors 210 may include a plurality of pogo pins 212 and a pogo board 214 for driving the connectors 210. The pogo pins 212 may be connected with a cable 237 for transmitting signals from the external modules 120 and 130 to the electronic parts.

For example, the cable 237 may be positioned via the cable 237 to connect electronic parts under the vent 232 and the connectors 210 over the vent 232.

According to various embodiments, the main body 110 may further include LEDs 234 for displaying driving information of the electronic device 100 through a side of the upper cover 220. For example, the electronic device 100 can show light diffused from the LEDs through the holder mount 224 of the upper cover 220.

For example, the LEDs 234, as shown in FIG. 2B, may be arranged in a circular shape to correspond to the shapes of the main body 110 and the holder mount 224.

The main body 110 according to various embodiments may further include a plurality of fastening screws 216, 236, 256, and 296 for fastening components.

Figure 3A:
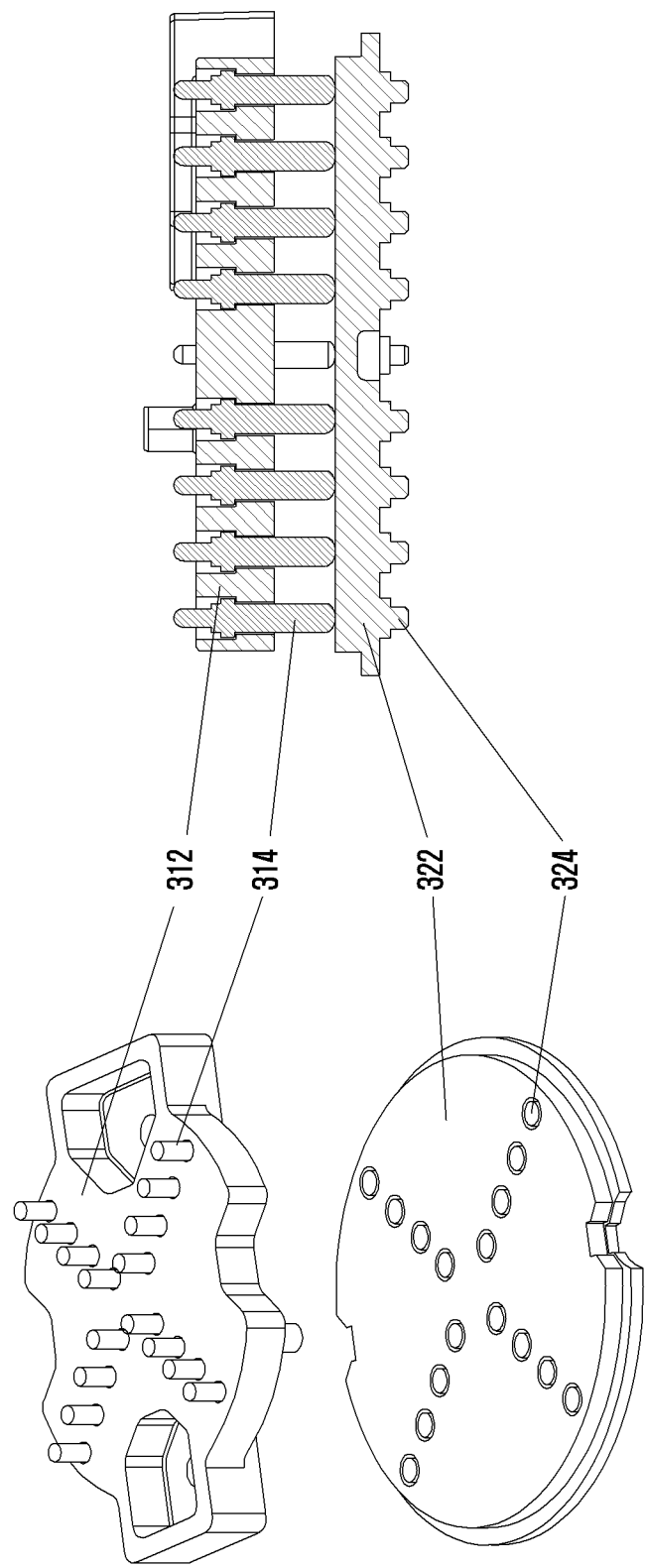
FIGS. 3A to 3C are views illustrating a connector structure according to various embodiments of the disclosure.
Figure 3B:
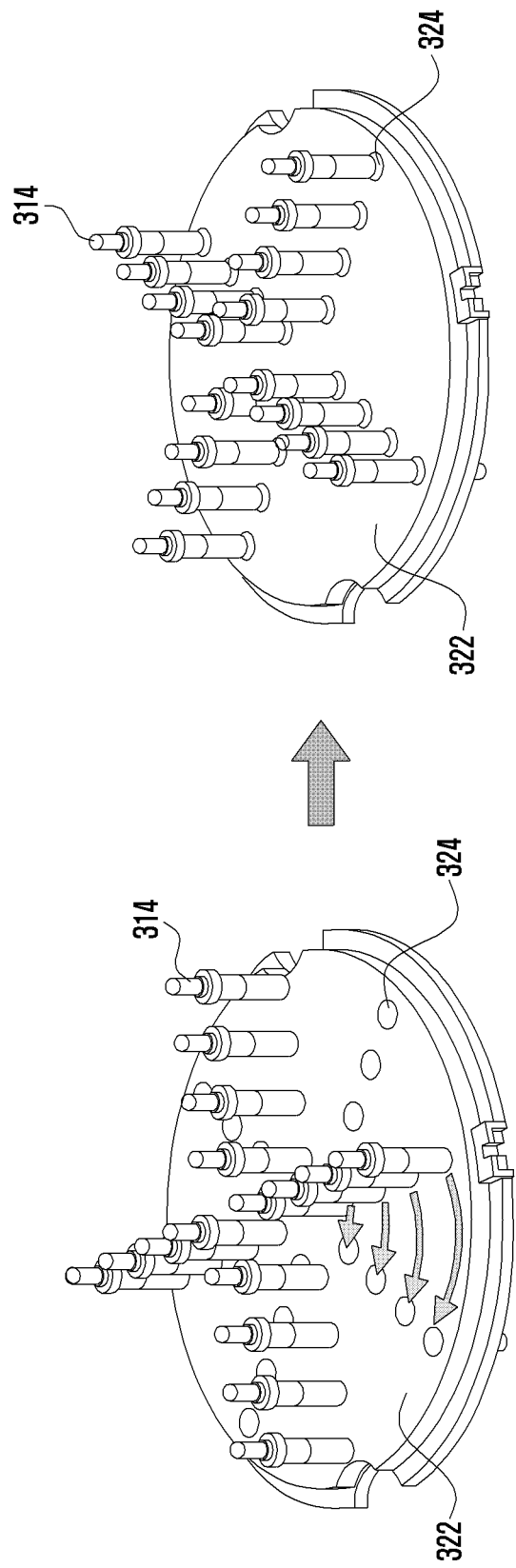
Figure 3C:
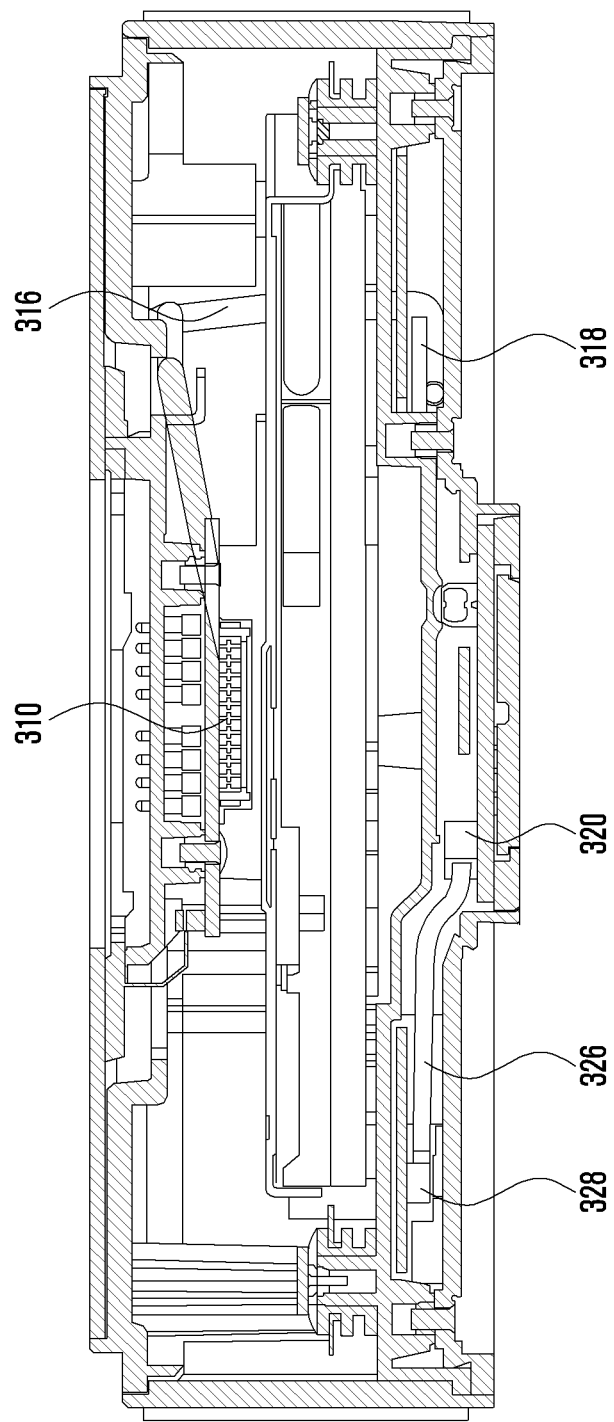

FIGS. 3A to 3C are views illustrating a connector structure according to various embodiments of the disclosure.

Referring to FIG. 3A, a connector may have a male connector and a female connector connected to the male connector.

For example, the male connector may be disposed at the upper portion of the main body 110 or the upper portions of the external modules 120 and 130, and the female connector may be disposed at the lower portions of the external modules 120 and 130.

According to an embodiment, the male connector at the upper portion of the main body 110 is connected with the female connectors at the lower portions of the external modules 120 and 130, thereby being able to electrically connect the main body 110 and the external modules 120 and 130.

For example, the male connector may include a male connector housing 312 and male connector contact pins 314.

The female connector may include a female connector housing 322 and female connector contact pins 324.

For example, the male connector housing 312 and the female connector housing 322 may have shapes corresponding to each other so that components can be mechanically engaged with each other when the main body 110 and the external modules 120 and 130 are coupled or the external modules 120 and 130 are coupled. For example, the male connector housing 312 and the female connector housing 322 may have fastening hooks.

According to various embodiments, the male connector pins 314 and the female connector pins 324 may be disposed at positions where they can come in contact with each other when they are coupled to each other.

For example, the contact pins 314 and 324 of the male connector and the female connector, as shown in FIG. 3A, may be arranged on two straight lines perpendicular to each other around the central axes of the connectors, respectively.

Referring to FIG. 3B, according to various embodiments, a main body and an external module can be fastened to each other (or an external module and a second external module can be fastened to each other) by at least partially rotating the external module (or the second external module) about the center axis of a connector.

The contact pins 314 and 324 can come in contact with corresponding contact pins when coupling even without coming in contact with a plurality of other contact pins when they are rotated, so it is possible to minimize wear due to contact with other contact pins by rotating.

FIG. 3C is a view illustrating a signal transmission method by connectors when a main body and an external module are fastened to each other (or an external module and a second external module are fastened to each other).

According to various embodiments, the male connector 310 may be disposed at the upper portion of the main body 110 or at the upper portions of the external modules 120 and 130.

For example, the male connector 310 may be electrically connected with the female connectors at the lower portions of the external modules 120 and 130 coupled from above the male connector 310.

For example, the male connector 310 can receive a signal through connection with the female connector of an external module and the signal can be transmitted to the connector board 318 from the male connector through a male connector connection cable 316. The male connector 310 can transmit a signal to the female connector of an external module coupled to the top of the male connector 310 and the signal may be transmitted from the connector board 318 through the male connector connection cable 316.

The female connector 320 according to various embodiments may be positioned at the lower portions of the external modules 120 and 130.

For example, the female connector 320 may be electrically connected with the male connector of a main body (or another external module) coupled to the bottom of the female connector 320.

For example, the female connector 320 can receive a signal from a main body (or another external module) or transmit a signal to the main body (or another external module) through connection with the male connector of the main body (or another external module).

The signals that are transmitted/received through the female connector 320 may be connected with the connector board 328 through a female connector connection cable 326.

Figure 4:
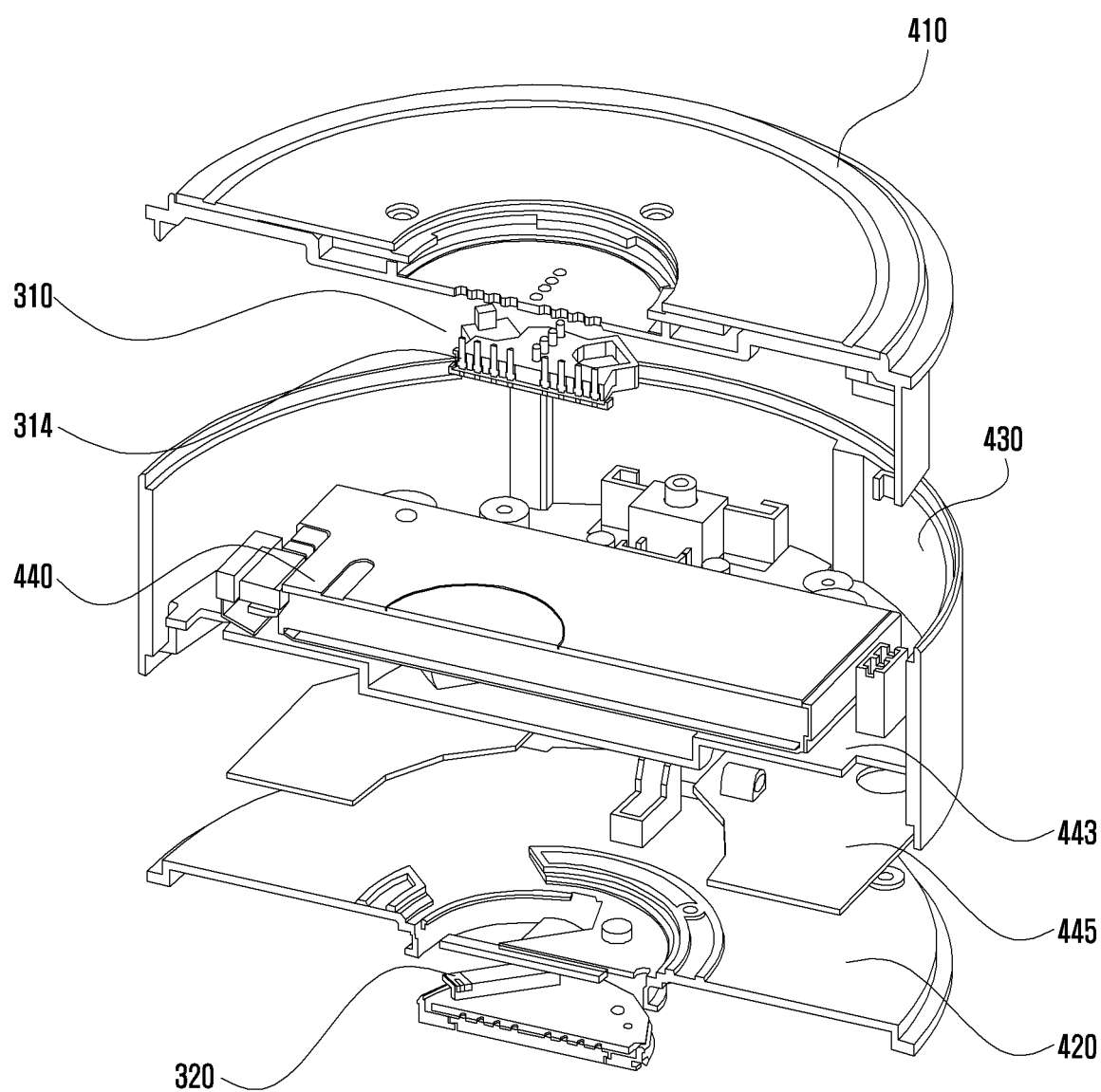
FIG. 4 is an exploded perspective view of external modules 120 and 130 according to various embodiments of the disclosure.

FIG. 4 is an exploded perspective view of the external modules 120 and 130 according to various embodiments of the disclosure.

Referring to FIG. 4, the external modules 120 and 130 according to various embodiments each may have a male connector 310 at the upper portion and a female connector 320 at the lower portion. The external module shown in FIG. 4 has both of the male connector 310 and the female connector 320, but according to another embodiment, the external modules 120 and 130 may not have the male connector 310 at the upper portion.

According to various embodiments, the external modules 120 and 130 may include module component 440 and a circuit board 445 for driving the module component 440. The external modules 120 and 130 may include a housing 443 for supporting the module component 440 and a module outer case 430 accommodating the module component 440, the housing 443, and the circuit board 445.

According to various embodiments, a module upper case 410 supporting the male connector 310 may be disposed over the module outer case 430. The module upper case 410 may have a fastening hook so that another external module can be mechanically coupled to the top of an external module. The male connector 310 has a plurality of pogo pins 314 and the pogo pins 314 can come in contact with the female connector of another external module when the another external module is fastened.

According to various embodiments, a module lower case 420 supporting the female connector 320 may be disposed under the module outer case 430. For example, the module lower case 420 may have a fastening hook so that the external module can be mechanically coupled to a main body or another external module.

The term "module" as used herein may, for example, mean a unit including one of hardware, software, and firmware or a combination of two or more of them. The "module" may be interchangeably used with, for example, the term "unit", "logic", "logical block", "component", or "circuit". The "module" may be the smallest unit of an integrated component or a part thereof. The "module" may be the smallest unit that performs one or more functions or a part thereof. The "module" may be mechanically or electronically implemented. For example, the "module" according to the disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments of the present disclosure, at least part of a device (e.g., modules or functions thereof) or a method (e.g., operations) according to the present disclosure be implemented, for example, by an instruction stored in a computer-readable storage media in a form of a programming module. When the instruction is executed by at least one processor, the at least one processor may perform a function corresponding to the instruction. The computer readable storage media may be, for example, the memory.

The computer-readable storage media may include Magnetic Media such as hard disk, floppy disk, or magnetic tape, Optical Media such as Compact Disc Read Only Memory (CD-ROM) or Digital Versatile Disc (DVD), Magneto-Optical Media such as floptical disk, and a hardware device such as Read Only Memory (ROM), Random Access Memory (RAM), or flash memory for storing and executing program commands (e.g., a programming module). Further, the program command may include a machine language code created by a compiler and a high-level language code executable by a computer using an interpreter. The foregoing hardware device may be configured to be operated according to at least one software module to perform an operation of the present disclosure, or software modules may be configured to be operated according to the hardware device.

According to various embodiments of the module and the program module may include at least one of above elements or may omit some elements or include other elements. According to various embodiments, operations performed by the module, the program, or another component may be carried out sequentially, in parallel, repeatedly, or heuristically, or one or more of the operations may be executed in a different order or omitted, or one or more other operations may be added.

Embodiments described herein are proposed to explain and help understand the disclosure and do not limit the scope of the disclosure. Accordingly, the scope of the disclosure should be construed as including all changes based on the spirit of the disclosure or other various embodiments.

The invention claimed is:

1. An electronic device comprising:
a case configured to accommodate at least one electronic part;
an upper cover configured to cover at least a portion of an upper end of the case; and
a connector disposed on the upper cover to electrically connect an external module and the at least one electronic part,
wherein the upper cover guides heat generated by the at least one electronic part so that the heat is discharged to the outside along a side of the upper cover.

2. The electronic device of claim 1, wherein the external module is attached to or detached from an upper portion of the electronic device by being rotated about a central axis of the connector.

3. The electronic device of claim 1, wherein the connector has a plurality of pogo pins.

4. The electronic device of claim 3, wherein the plurality of pogo pins are arranged on two straight lines perpendicular to each other around the central axis of the connector.

5. The electronic device of claim 1, wherein the external module includes at least one of a storage module, an audio output module, or a camera module.

6. The electronic device of claim 5, wherein the storage module includes an HDD.

7. The electronic device of claim 1, further comprising a heat sink and a cooling fan in the case,
wherein the cooling fan discharges air flowing inside from a lower portion of the electronic device to the outside along a side of the cover.

8. The electronic device of claim 1, having a substantially cylindrical structure.

9. The electronic device of claim 1, wherein the upper cover has LEDs configured to display driving information of the electronic device through a side of the upper cover.

10. The electronic device of claim 2, wherein the connector disposed on the upper cover includes a male connector,
wherein the external module includes a female connector corresponding to the male connector on a bottom of the external module that faces the electronic device when the external module is attached to the electronic device.

11. The electronic device of claim 10, wherein the external module further includes a male connector on a top of the external module that is opposite to the bottom, wherein the male connector of the external module electrically connects the external module to a second external module attached to an upper portion of the external module.

12. The electronic device of claim 11, wherein the second external module includes at least one of a storage module, an audio output module, or a camera module.

13. The electronic device of claim 1, further comprising at least one antenna,
wherein the at least one antenna is disposed at an upper end of the case.

14. An electronic device comprising:
a case configured to accommodate at least one electronic part;
a vent disposed at an upper portion of the case;
an upper cover configured to cover at least a portion of the case; and
a connector disposed on the upper cover to electrically connect an external module and the at least one electronic part,
wherein the vent guides heat generated by the at least one electronic part so that the heat is discharged to the upper cover,
wherein the upper cover guides the heat generated by the at least one electronic part so that the heat is discharged to the outside along a side of the upper cover.

15. An electronic device comprising:
a case configured to accommodate at least one electronic part;
a vent disposed at an upper portion of the case;
an upper cover configured to cover at least a portion of the case;
a connector disposed on the upper cover to electrically connect an external module and the at least one electronic part; and
a cable configured to transmit a signal from the connector to the electronic part,
wherein the vent guides heat generated by the at least one electronic part so that the heat is discharged to the upper cover,
wherein the cable is disposed through the vent.

* * * * *